United States Patent
Wang et al.

(10) Patent No.: US 8,809,881 B2
(45) Date of Patent: Aug. 19, 2014

(54) LIGHT-EMITTING DEVICE

(75) Inventors: Hsin-Ying Wang, Hsinchu (TW);
Yi-Ming Chen, Hsinchu (TW);
Tzu-Chieh Hsu, Hsinchu (TW);
Chi-Hsing Chen, Hsinchu (TW);
Hsiang-Ling Chang, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 0 days.

(21) Appl. No.: 13/190,937

(22) Filed: Jul. 26, 2011

(65) Prior Publication Data

US 2012/0018750 A1 Jan. 26, 2012

(30) Foreign Application Priority Data

Jul. 26, 2010 (TW) .............................. 099124637 A

(51) Int. Cl.
H01L 29/20 (2006.01)
H01L 27/15 (2006.01)
H01L 27/146 (2006.01)
H01L 33/42 (2010.01)

(52) U.S. Cl.
CPC ......... H01L 27/156 (2013.01); *H01L 27/14636* (2013.01); *H01L 33/42* (2013.01)
USPC ........................................................ 257/89

(58) Field of Classification Search
CPC .. H01L 27/156; H01L 27/14636; H01L 33/42
USPC ........................................................ 257/89
See application file for complete search history.

(56) References Cited

U.S. PATENT DOCUMENTS

| 6,856,087 B2 | 2/2005 | Lin et al. |
| 6,913,985 B2 | 7/2005 | Ogihara et al. |

(Continued)

FOREIGN PATENT DOCUMENTS

| CN | 101465402 A | 6/2009 |
| EP | 1 418 624 A2 | 5/2004 |

(Continued)

OTHER PUBLICATIONS

Park et al, "Printed Assemblies of Inorganic Light-Emitting Diodes for Deformable and Semitransparent Displays", Aug. 21, 2009, Science, vol. 325, pp. 977-981.*

(Continued)

*Primary Examiner* — Kimberly Rizkallah
*Assistant Examiner* — Alexander Belousov
(74) *Attorney, Agent, or Firm* — Muncy, Geissler, Olds & Lowe, P.C.

(57) ABSTRACT

A semiconductor optoelectronic device comprises an operating substrate; a semiconductor epitaxial stack unit disposed on the operating substrate comprising a first semiconductor material layer having a first electrical conductivity disposed on the operating substrate and a second semiconductor material layer having a second electrical conductivity disposed on the first semiconductor material layer; a transparent conductive layer disposed on the second semiconductor material layer, wherein the transparent conductive layer comprises a first surface, a directly contacting part disposed on the first surface and directly contacting with the second semiconductor material layer, a second surface substantially parallel with the first surface, and a directly contacting corresponding part disposed on the second surface corresponding to the directly contacting part; and a first electrode disposed on the operating substrate and electrically connected with the semiconductor epitaxial stack by the transparent conductive layer, wherein the first electrode is connected with the transparent conductive layer by an area excluding the directly contacting part and the directly contacting corresponding part.

6 Claims, 9 Drawing Sheets

(56) References Cited

U.S. PATENT DOCUMENTS

| | | | |
|---|---|---|---|
| 6,956,241 B2 * | 10/2005 | Sugawara et al. | 257/79 |
| 7,180,099 B2 | 2/2007 | Ogihara et al. | |
| 7,281,816 B2 * | 10/2007 | Suzuki | 362/231 |
| 7,432,117 B2 | 10/2008 | Chu et al. | |
| 7,557,367 B2 | 7/2009 | Rogers et al. | |
| 2004/0259331 A1 | 12/2004 | Ogihara et al. | |
| 2008/0266843 A1 * | 10/2008 | Villard | 362/147 |

FOREIGN PATENT DOCUMENTS

| | | |
|---|---|---|
| TW | 434917 B | 5/2001 |
| TW | I260800 B | 8/2006 |
| TW | 200943579 A | 10/2009 |
| TW | 200947665 A | 11/2009 |
| WO | WO2008/143635 A1 | 11/2008 |

OTHER PUBLICATIONS

Park et al, "Supporting Online Material for Printed Assemblies of Inorganic Light-Emitting Diodes for Deformable and Semitransparent Displays", Aug. 21, 2009, Science, vol. 325.*

Sang-Il Park, et al., "Printed Assemblies of Inorganic Light-Emitting Diodes for Deformable and Semitransparent Displays", Science 325, 977 (2009) Aug. 21, 2009.

* cited by examiner

LIGHT-EMITTING DEVICE

TECHNICAL FIELD

The application relates to a semiconductor optoelectronic device and a manufacturing method thereof, and in particular, to the semiconductor optoelectronic device transferred to an operating substrate and the manufacturing method thereof.

REFERENCE TO RELATED APPLICATION

This application claims the right of priority based on Taiwan application Serial No. 099124637, filed on Jul. 26, 2010, and the content of which is hereby incorporated by reference in its entirety.

DESCRIPTION OF BACKGROUND ART

The science and technology change every day, and the semiconductor optoelectronic device contributes to the information transmission and the energy conversion. Taking the application of the system as an example, the semiconductor optoelectronic device contributes to the optic fiber communication, the optical storage and the military system. The semiconductor optoelectronic device is classified into three types according to the energy conversion: conversion from electricity into light emission such as light emitting diodes and laser diodes; conversion from optical signal into electronic signal such as optical detectors; conversion from light radiation into electricity such as solar cells.

The growth substrate is important for the semiconductor optoelectronic device. The semiconductor epitaxial structure of the semiconductor optoelectronic device is grown on the substrate which also provides the support function. Thus, choosing a suitable growth substrate is a key factor for the growth quality of the semiconductor optoelectronic device.

However, sometimes a good substrate for growing the device may not be a good substrate for supporting the device. Taking the light-emitting diode as an example, the opaque GaAs substrate is used to be the growth substrate to raise the growth quality of the device in the light emitting device dedicating to the red light emission, because the lattice constant of the GaAs is close to that of the semiconductor epitaxial structure. But for the light emitting device dedicating to the light emission, the opaque growth substrate reduces the light emission efficiency of the device during the operation.

A substrate transfer technology is developed to satisfy the different requirements of the growth substrate and the support substrate of the semiconductor optoelectronic device. The semiconductor epitaxial structure is grown on the growth substrate first, and then the semiconductor epitaxial structure is transferred to the support substrate for the following device operation. The removal of the original growth substrate is a key factor of the transfer method after combining the semiconductor epitaxial structure and the support substrate.

In the conventional technology, the removal method of the growth substrate includes: dissolving the original growth substrate with the etchant, physically polishing, or disposing a sacrificial layer between the growth substrate and the semiconductor epitaxial structure in advance and then separating the growth substrate and the semiconductor by etching the sacrificial layer. However, whether dissolving the substrate with the etchant or polishing the substrate physically, that is a kind of destruction for the original growth substrate. In the modern-day of environmental protection and energy conservation, the growth substrate not being re-used is undoubtedly a waste of the materials. However, how to selectively transfer is one of the research directions for the semiconductor optoelectronic device while using the sacrificial layer for separation purpose.

SUMMARY OF THE APPLICATION

In order to transfer the semiconductor optoelectronic device selectively and efficiently, the present application provides a semiconductor optoelectronic device and a manufacturing method thereof, and in particular, to the semiconductor optoelectronic device transferred to an operating substrate and the manufacturing method thereof.

An embodiment of the present application provides a semiconductor optoelectronic device comprising an operating substrate; a semiconductor epitaxial stack unit disposed on the operating substrate comprising a first semiconductor material layer having a first electrical conductivity disposed on the operating substrate and a second semiconductor material layer having a second electrical conductivity disposed on the first semiconductor material layer; a transparent conductive layer disposed on the second semiconductor material layer, wherein the transparent conductive layer comprises a first surface, a directly contacting part disposed on the first surface and directly contacting with the second semiconductor material layer, a second surface substantially parallel with the first surface and a directly contacting corresponding part disposed on the second surface corresponding to the directly contacting part; and a first electrode disposed on the operating substrate and electrically connected with the semiconductor epitaxial stack unit by the transparent conductive layer, wherein the first electrode and the transparent conductive layer are electrically connected each another by an area excluding the directly contacting part and the directly contacting corresponding part.

Another embodiment of the application provides a manufacturing method of the semiconductor optoelectronic device. The method comprises providing a growth substrate; disposing a sacrificial layer on the growth substrate; disposing a semiconductor epitaxial stack on the sacrificial layer; separating the semiconductor epitaxial stack into a plurality of semiconductor epitaxial stack units and exposing the sacrificial layer under the semiconductor epitaxial stack unit; disposing a patterned photoresist, and covering part of the semiconductor epitaxial stack unit and part of the exposed sacrificial layer; removing the sacrificial layer not covered by the patterned photoresist; providing a transfer structure and transferring the semiconductor epitaxial stack unit whose sacrificial layer is removed to the transfer structure; providing an operating substrate comprising a plurality of electrode areas and a plurality of epitaxial areas, and the electrode area and the epitaxial area are separated at intervals; transferring the semiconductor epitaxial stack unit of the transfer structure to the epitaxial area of the operating substrate; and disposing a plurality of first electrodes on the electrode area of the operating substrate, wherein the first electrode is electrically connected with the semiconductor epitaxial stack unit which is transferred.

Another embodiment of the application provides a light-emitting diode device structure, which comprises an operating substrate with a surface comprising a plurality of first epitaxial areas and a plurality of second epitaxial areas; a plurality of first light-emitting diode epitaxial stack units disposed on the first epitaxial area and capable of emitting a first major emission wavelength, wherein any one of the first light-emitting diode epitaxial stack units comprises a first side parallel to the surface of the operating substrate, and the extension line of the first side has a first extension direction substantially parallel to one another; a plurality of second light-emitting diode epitaxial stack units disposed on the second epitaxial area and capable of emitting a second major emission wavelength, wherein any one of the second light-emitting diode epitaxial stack units comprises a second side corresponding to the first side, and the extension line of the second side has a second extension direction substantially parallel to one another; and a first direction vertical to the normal line of the surface of the operating substrate, wherein the first extension direction and the first direction comprise an angle $\theta_1$, the second extension direction and the first direction comprise an angle $\theta_2$, and $\theta_1$ is not equal to $\theta_2$.

According to another embodiment of the application, wherein any one of the first light-emitting diode epitaxial stack units and/or any one of the second light-emitting diode epitaxial stack units further comprise a first electrode disposed on opposite side of the semiconductor epitaxial stack unit corresponding to the operating substrate, or between the semiconductor epitaxial stack unit and the operating substrate, or on opposite side of the operating substrate corresponding to the semiconductor epitaxial stack unit.

DETAILED DESCRIPTION OF PREFERRED EMBODIMENTS

Figure 1A:
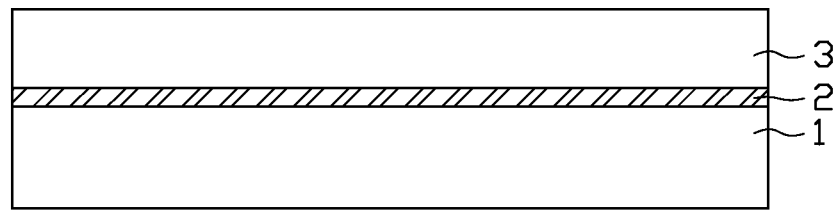
FIG. 1A illustrates a lateral view of the first step of the manufacturing method of a semiconductor optoelectronic device.
Figure 1B:
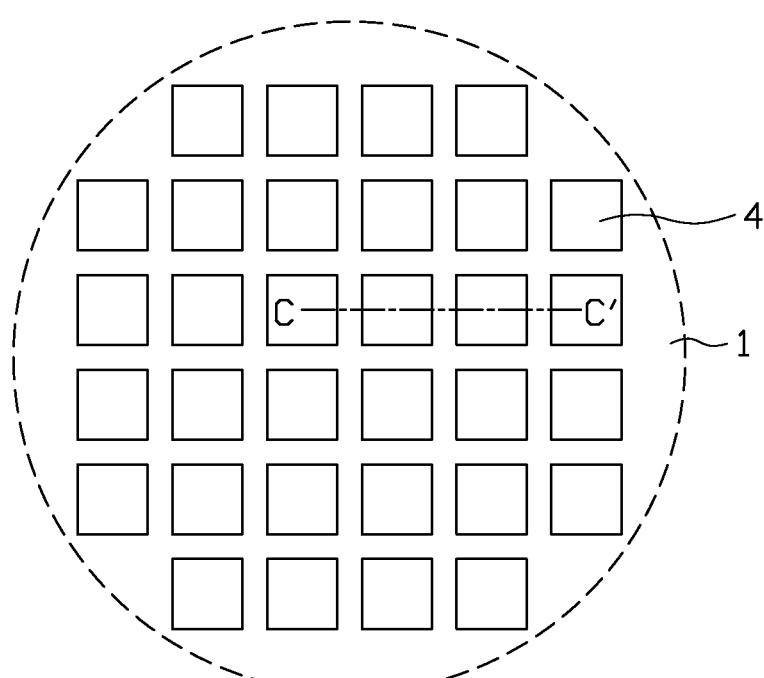
FIG. 1B illustrates a vertical view of the first step of the manufacturing method of a semiconductor optoelectronic device.
Figure 1C:
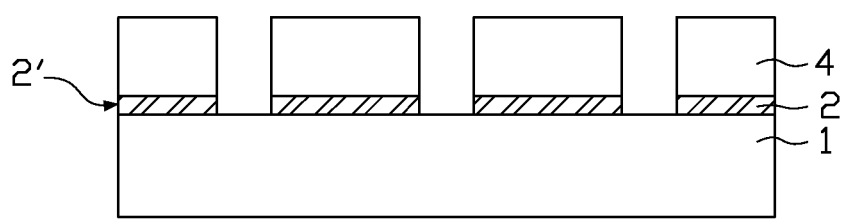
FIG. 1C illustrates a lateral view taken along line C-C' in FIG. 1B.

With reference to FIG. 1, a manufacturing method of a semiconductor optoelectronic device according to an embodiment of the present application is described. As shown in FIG. 1A, a growth substrate 1 is provided first, a sacrificial layer 2 is disposed on the growth substrate 1, and a semiconductor epitaxial stack 3 is disposed on the sacrificial layer 2. The material of the growth substrate 1 comprises sapphire ($Al_2O_3$), silicon (Si), silicon carbide (SiC), gallium nitride (GaN), or gallium arsenide (GaAs). The material of the sacrificial layer 2 comprises aluminum arsenide (AlAs), aluminum gallium arsenide (AlGaAs), or zinc oxide (ZnO). The semiconductor epitaxial stack 3 can be a light-emitting diode epitaxial stack and/or a solar cell epitaxial stack. As shown in FIG. 1B and FIG. 1C, the semiconductor epitaxial stack is separated into a plurality of semiconductor epitaxial stack units 4 by the conventional manufacturing method such as dry etch, wet etch, and laser scribing. As shown in FIG. 1C, a sidewall 2' of the sacrificial layer 2 under the plurality of semiconductor epitaxial stack units 4 is exposed after the separation. Similarly, the semiconductor epitaxial stack unit 4 can be the light-emitting diode epitaxial stack area and/or the solar cell epitaxial stack area.

Figure 2:
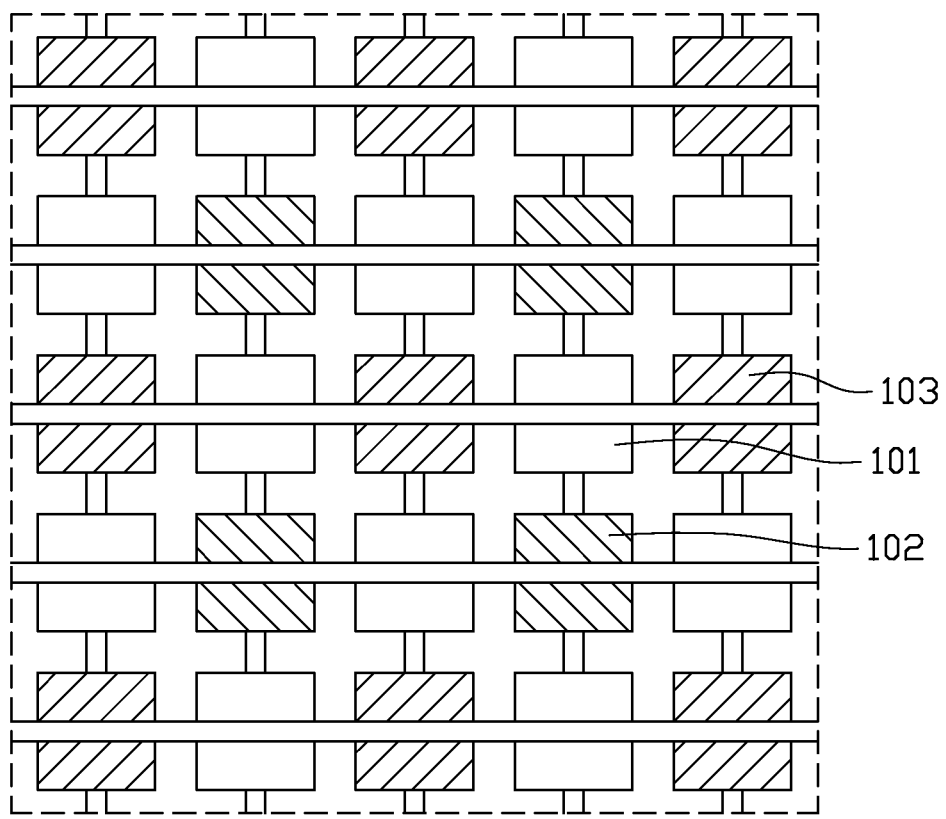
FIG. 2 illustrates a vertical view of a multi-color display device.

After the plurality of semiconductor epitaxial stack units 4 is disposed on the growth substrate 1 by the above-described method, the semiconductor epitaxial stack unit is selectively transferred to an operating substrate based on the following processes or the application requirement. Taking FIG. 2 as an example, a multi-color display device comprises a red light semiconductor epitaxial stack unit 101, a green light semiconductor epitaxial stack unit 102, and a blue light semiconductor epitaxial stack unit 103. For the multi-color display device, when the plurality of semiconductor epitaxial stack units 4 of the growth substrate emits the red light wavelength, the semiconductor epitaxial stack units 4 are alternately and selectively transferred to the operating substrate, namely, the multi-color display device, from the growth substrate 1 based on the disposition of the red light semiconductor epitaxial stack unit 101 on the multi-color display device.

Figure 3A:
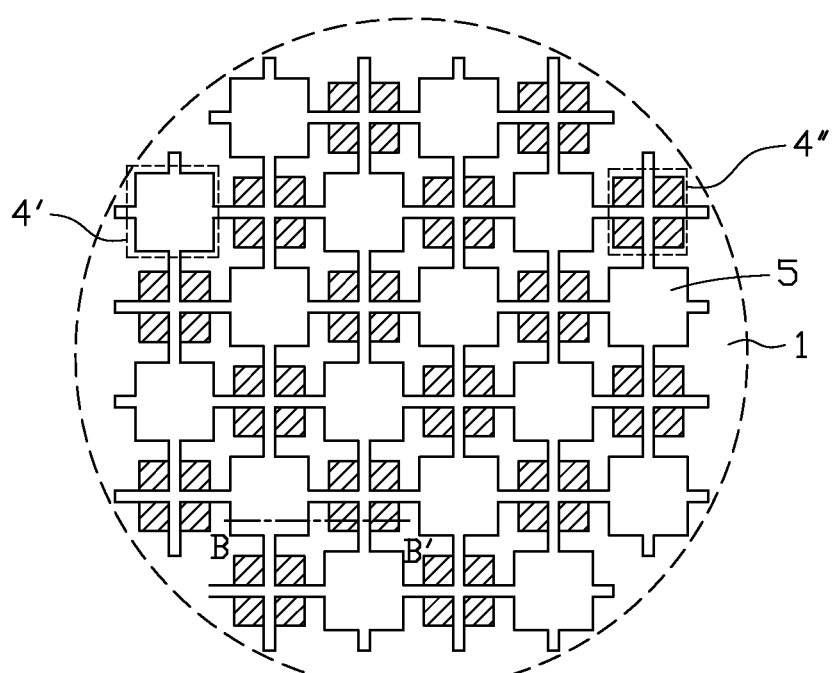
FIG. 3A illustrates a vertical view of the second step of the manufacturing method of a semiconductor optoelectronic device.
Figure 3B:
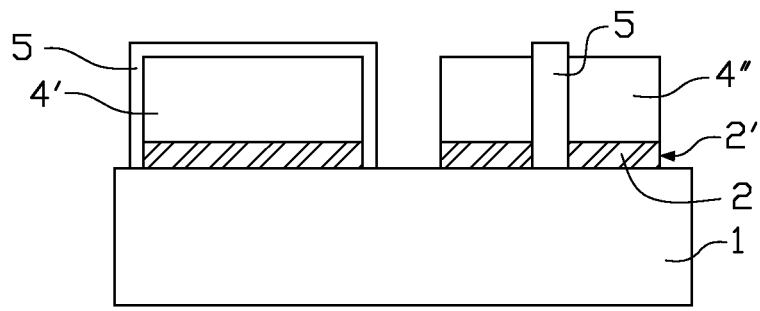
FIG. 3B illustrates a lateral view taken along line B-B' in FIG. 3A.
Figure 3C:
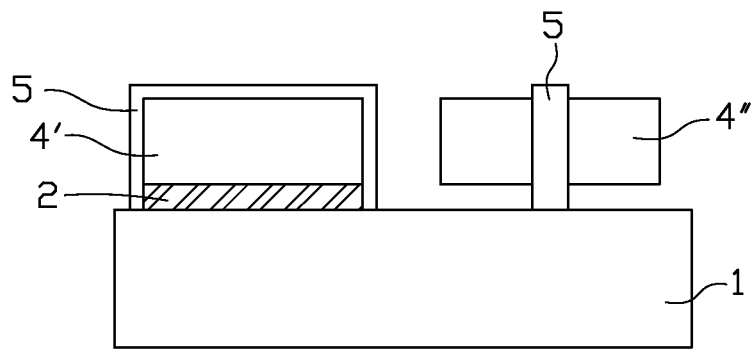
FIG. 3C illustrates a lateral view of the third step of the manufacturing method of a semiconductor optoelectronic device.

For the transferring process described in FIGS. 3A-3C, a second semiconductor epitaxial stack unit 4″ which needs to be transferred and a first semiconductor epitaxial stack unit 4′ which does not need to be transferred are covered by different photoresist to be selectively transferred later with the following steps. As shown in FIG. 3A and FIG. 3B, part of the semiconductor epitaxial stack unit 4 is covered by a patterned photoresist layer 5 in order to selectively transfer specific part of the semiconductor epitaxial stack unit 4—the surface of the semiconductor epitaxial stack and the exposed sidewall 2' of the sacrificial layer under the semiconductor epitaxial stack of the first semiconductor epitaxial stack unit 4' which does not need to be transferred are totally covered by the photoresist; part of the surface of the second semiconductor epitaxial stack unit 4" which needs to be transferred is covered by the patterned photoresist 5 for fixation purpose, and the sidewall 2' of the sacrificial layer is exposed. The sacrificial layer 2 of the second semiconductor epitaxial stack unit 4" is removed via the exposed sidewall 2' of the sacrificial layer by the etchant. After the step, the sacrificial layer 2 under part of the semiconductor epitaxial stack unit 4 is selectively removed. FIG. 3C illustrates the lateral view of the result that part of the sacrificial layer 2 is removed by taking along the line B-B' in FIG. 3A.

After all of the semiconductor epitaxial stack units 4 on the growth substrate are removed by the method, the original growth substrate can be recycled for use after common clean process because the original growth substrate is not damaged.

In addition, the adhesion between the sacrificial layer 2 and the semiconductor epitaxial stack unit 4 can also be reduced by the wet-oxygen etching that changes the characteristics of the material of the sacrificial layer.

Figure 4A:
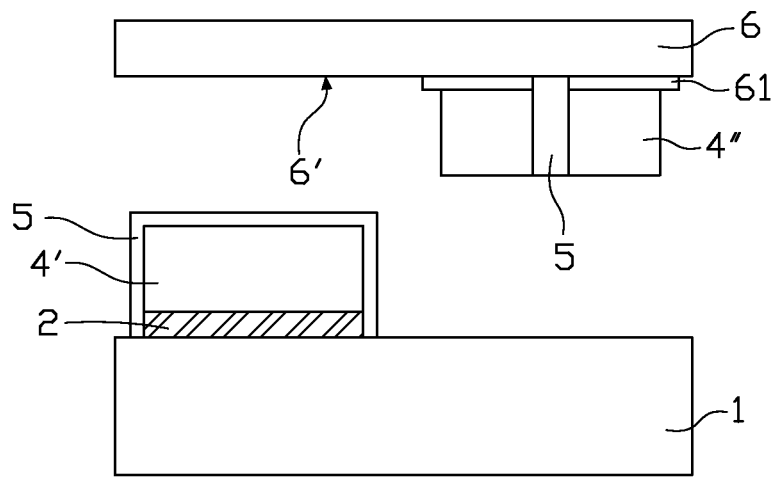
FIG. 4A illustrates a lateral view of part of the fourth step of the manufacturing method of a semiconductor optoelectronic device.

In order to selectively transfer part of the semiconductor epitaxial stack unit whose sacrificial layer 2 is removed efficiently, namely, the second semiconductor epitaxial stack unit 4", a transfer structure 6 is used for the transfer process. The material of the transfer structure 6 comprises organic polymer materials like expanded polystyrene or PI tape. The transfer structure 6 comprises a transfer surface 6' facing the semiconductor epitaxial stack unit 4. The transfer surface 6' comprises an adhesive surface, or at least one protrusion 61 corresponding to the second semiconductor epitaxial stack unit 4" which needs to be transferred. The second semiconductor epitaxial stack unit 4" is transferred to the transfer structure 6 by the adhesion of the transfer surface 6', or the electrostatic attraction of the electric charges accumulated between the protrusion 61 of the transfer surface and the surface of the second semiconductor epitaxial stack unit 4" as shown in FIG. 4A.

Figure 4B:
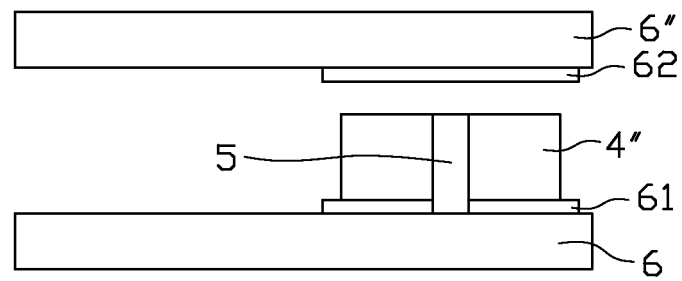
FIG. 4B illustrates a lateral view of the selective step of the fourth step of the manufacturing method of a semiconductor optoelectronic device.
Figure 4C:
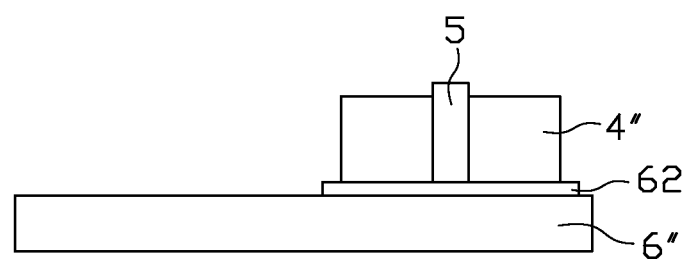
FIG. 4C illustrates a lateral view of the selective step of the fourth step of the manufacturing method of a semiconductor optoelectronic device.
Figure 4D:
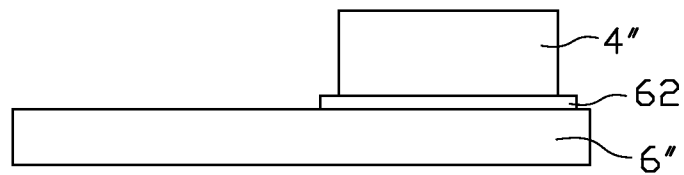
FIG. 4D illustrates a lateral view of the selective step of the fourth step of the manufacturing method of a semiconductor optoelectronic device.

In addition, part of the patterned photoresist layer 5 still sticks to the second semiconductor epitaxial stack unit 4" which is transferred to the transfer structure 6. Therefore, a second transfer process is performed to remove the patterned photoresist layer 5, or to invert the second semiconductor epitaxial stack unit 4" onto the operating substrate when the structure design requires. As shown in FIGS. 4B-4D, the original patterned photoresist layer 5 covering part of the second semiconductor epitaxial stack unit 4" still sticks to the second semiconductor epitaxial stack unit 4" and the transfer structure 6 and is not removed when the second semiconductor epitaxial stack unit 4" is transferred to the transfer structure 6. In that case, the second semiconductor epitaxial stack unit 4" disposed on the transfer structure 6 can be transferred to a second transfer structure 6" first, the patterned photoresist layer 5 stuck to the second semiconductor epitaxial stack unit 4" is removed by the photoresist remover, and the second semiconductor epitaxial stack unit 4" disposed on the second transfer structure 6" is transferred to the operating substrate 7 in the second transfer process. Similarly, the material of the second transfer structure 6" comprises organic polymer materials like expanded polystyrene or PI tape. The second transfer structure 6" comprises a transfer surface facing the transferred semiconductor epitaxial stack unit 4". The transfer surface comprises an adhesive surface or at least one protrusion 62 corresponding to the second semiconductor epitaxial stack unit 4" which needs to be transferred. The second semiconductor epitaxial stack unit 4" is transferred to the second transfer structure 6" by the adhesion of the second transfer structure 6", or the electrostatic attraction of the electric charges accumulated between the protrusion 62 of the transfer surface and the surface of the second semiconductor epitaxial stack unit 4".

Figure 4E:
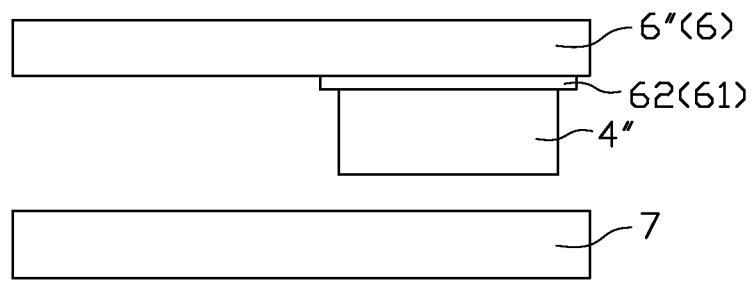
FIG. 4E illustrates a lateral view of the selective step of the fourth step of the manufacturing method of a semiconductor optoelectronic device.

As shown in FIG. 4E, the second semiconductor epitaxial stack unit 4" is transferred from the second transfer structure 6" to the operating substrate 7. The second semiconductor epitaxial stack unit 4" can be transferred from the transfer structure 6 to the operating substrate 7 in the similar method if the transfer process is prosecuted once.

Figure 5A:
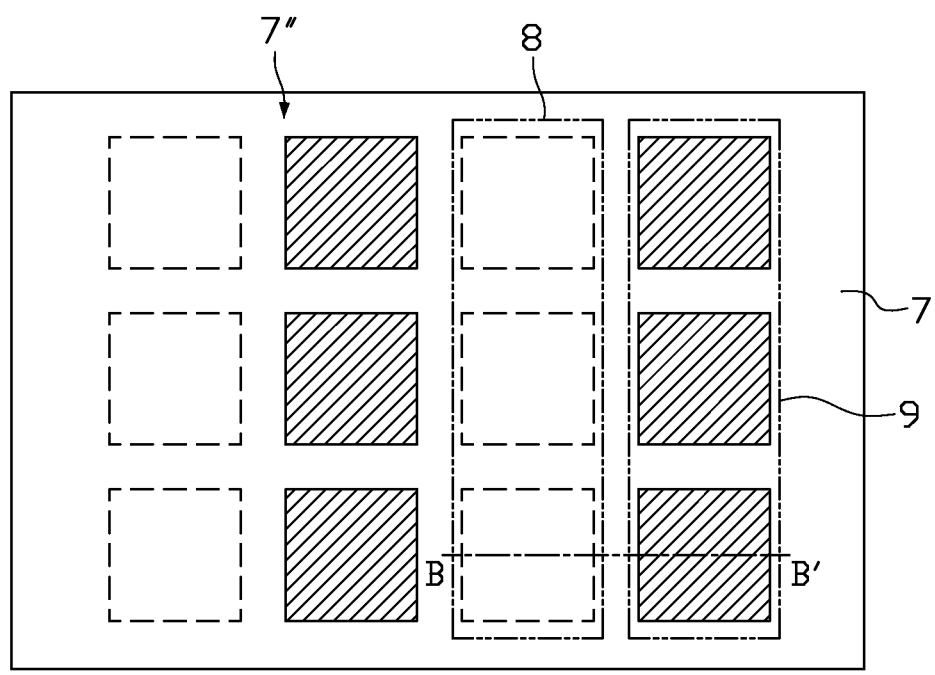
FIG. 5A illustrates a vertical view of the fifth step of the manufacturing method of a semiconductor optoelectronic device.
Figure 5B:
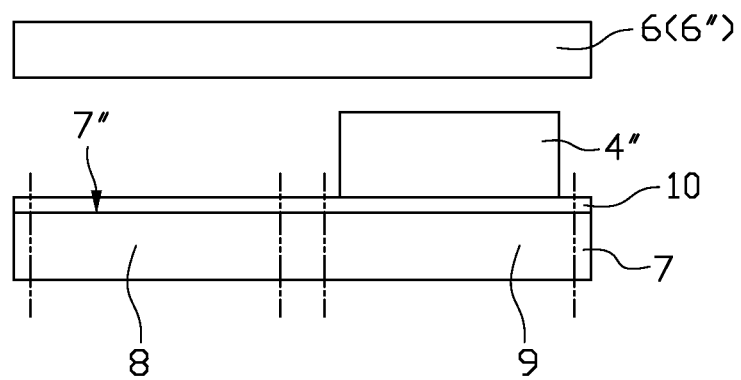
FIG. 5B illustrates a lateral view taken along line B-B' in FIG. 5A.

As shown in FIG. 5A, the operating substrate 7 comprises a plurality of electrode areas 8 and a plurality of epitaxial areas 9. The electrode area 8 and the epitaxial area 9 are disposed at intervals. The material of the operating substrate 7 comprises sapphire ($Al_2O_3$), silicon (Si), silicon carbide (SiC), gallium nitride (GaN), gallium arsenide (GaAs), and aluminum nitride (AlN). Or, the operating substrate 7 can be a PCB substrate or a FR4 substrate. The method to transfer the plurality of the second semiconductor epitaxial stack units 4" disposed on the transfer structure 6 (or the second transfer structure 6") to the operating substrate 7 is by disposing an adhesive layer 10 between the operating substrate 7 and the second semiconductor epitaxial stack unit 4", and sticking the operating substrate 7 and the second semiconductor epitaxial stack unit 4" through heating. Because the adhesion between the second semiconductor epitaxial stack unit 4" and the transfer structure 6 (6") is reduced by heating (the adhesion of the transfer surface 6' is reduced by heating) and the adhesion produced by the adhesive layer 10, the second semiconductor epitaxial stack unit 4" is transferred to the operating substrate 7 from the transfer structure 6 (6"). The material of the adhesive layer 10 comprises organic polymer, metal, and metal alloy. In addition, in order to increase the light emission efficiency or for other purposes, the surface 7" of the operating substrate 7 is optionally textured by comprising at least a protrusion (not shown in the drawings) and/or a cavity (not shown in the drawings). As shown in FIG. 5B, the second semiconductor epitaxial stack unit 4" is selectively transferred to the epitaxial area 9 of the operating substrate 7, and is disposed at intervals relative to the electrode area 8.

Figure 6:
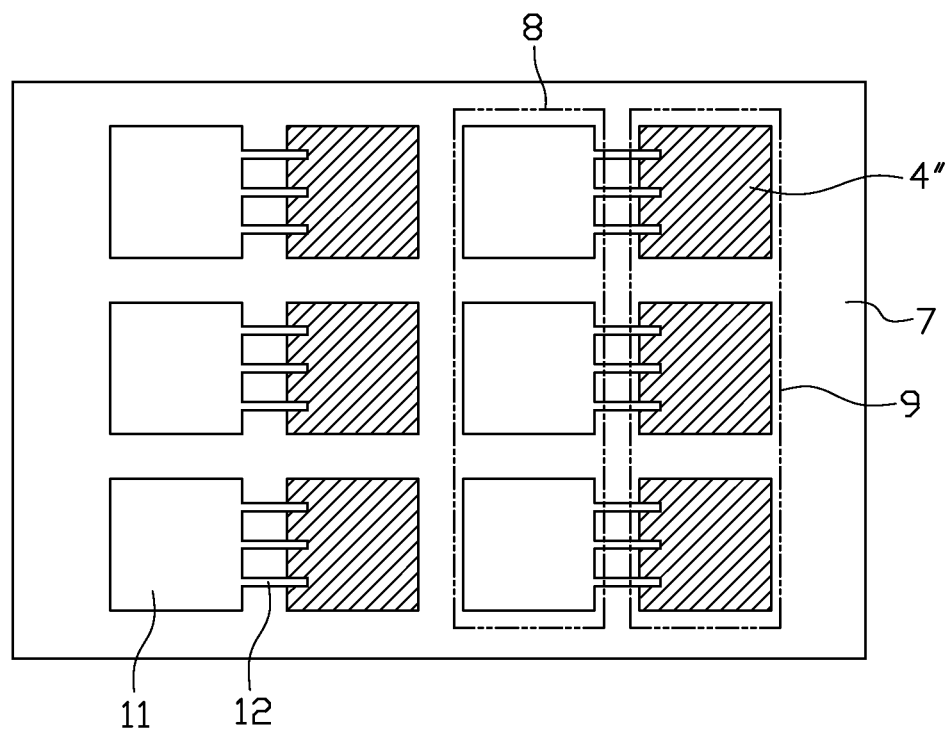
FIG. 6 illustrates a vertical view of the sixth step of the manufacturing method of a semiconductor optoelectronic device.

Finally, as shown in FIG. 6, a first electrode 11 is formed on the electrode area 8 of the operating substrate 7. The first electrode 11 is electrically connected to the second semiconductor epitaxial stack unit 4" which is transferred to and disposed on the corresponding epitaxial area 9 by a metal wire 12 extending from the first electrode 11 or other conductive medium like indium tin oxide, cadmium tin oxide, zinc oxide, indium oxide, tin oxide, copper aluminum oxide, copper gallium oxide, strontium copper oxide, aluminum zinc oxide, zinc gallium oxide, and transparent conductive materials arbitrary composed by the materials mentioned above.

In addition, the process steps further comprise forming a second electrode (not shown in the drawings) between the second semiconductor epitaxial stack unit 4" and the operating substrate 7, or on opposite side of the operating substrate 7 corresponding to the second semiconductor epitaxial stack unit 4" for the electrical conductivity purpose of the device.

Figure 7A:
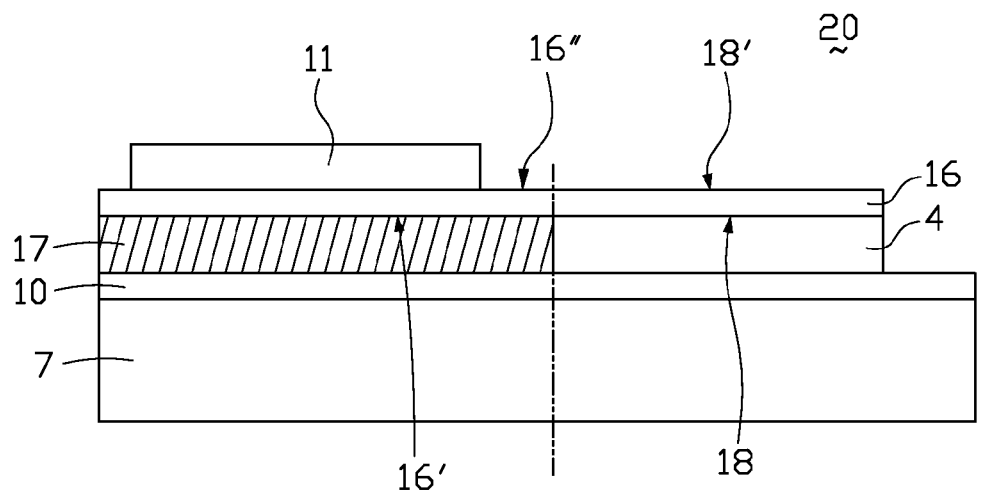
FIG. 7A illustrates a lateral view of a semiconductor optoelectronic device structure according to another embodiment of the present application.
Figure 8:
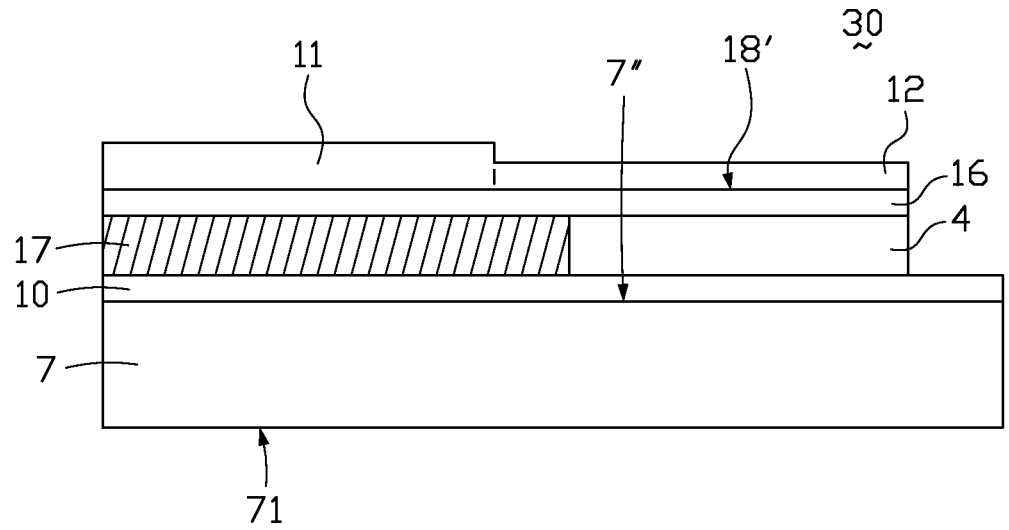
FIG. 8 illustrates a lateral view of a semiconductor optoelectronic device structure according to another embodiment of the present application.

FIG. 7A and FIG. 8 illustrate the lateral views of a semiconductor optoelectronic device 20 and a semiconductor optoelectronic device 30 disposed according to the method disclosed in the embodiments of the present application. The semiconductor optoelectronic devices 20 and 30 can be a solar cell or a light-emitting diode.

Figure 7B:
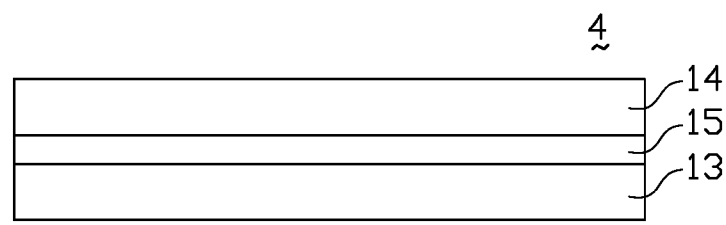
FIG. 7B illustrates a lateral view of the semiconductor epitaxial stack unit 4 in FIG. 7A.
Figure 7C:
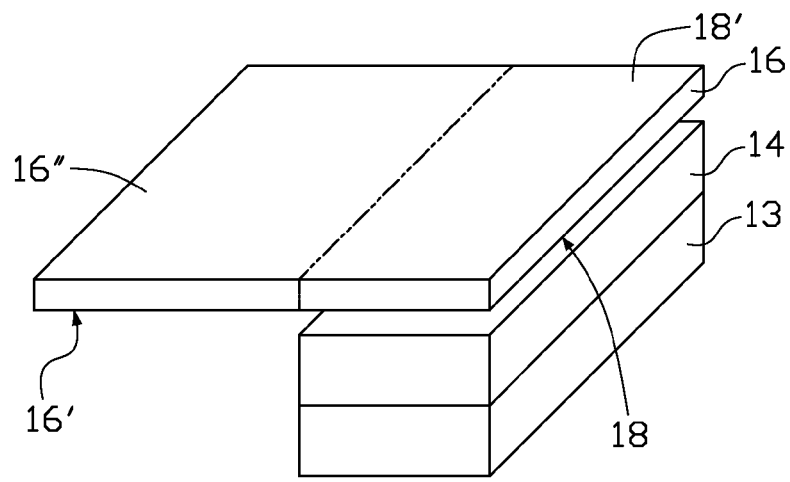
FIG. 7C illustrates an exploded perspective view of the semiconductor epitaxial stack unit 4 and the transparent conductive layer 16 in FIG. 7A.

As shown in FIGS. 7A-7C, the semiconductor optoelectronic device 20 comprises an operating substrate 7 and a semiconductor epitaxial stack unit 4 disposed on the operating substrate 7. Zooming in the view of the semiconductor epitaxial stack unit 4 as shown in FIG. 7B, the semiconductor epitaxial stack unit 4 comprises a first semiconductor material layer 13 having a first electrical conductivity disposed on the operating substrate, such as the p-type semiconductor material layer, and a second semiconductor material layer 14 having a second electrical conductivity disposed on the first semiconductor material layer 13, such as the n-type semiconductor material layer. When the semiconductor optoelectronic devices 20 and 30 are the light-emitting diode devices, the semiconductor epitaxial stack unit 4 further comprises a light-emitting layer 15 disposed between the first semiconductor material layer 13 and the second semiconductor material layer 14.

As shown in FIG. 7A, the semiconductor optoelectronic device 20 further comprises a transparent conductive layer 16 disposed on the operating substrate 7. The transparent conductive layer 16 comprises a first surface 16' and a second surface 16" approximately parallel to the first surface. A directly contacting part 18 is defined as the area where the second semiconductor material layer 14 directly contacts part of the transparent conductive layer 16. A directly contacting corresponding part 18' is defined as the area where the second surface 16" is corresponding to the directly contacting part of the first surface 16' as shown in FIG. 7C. In order to clearly illustrate the contacting area of the transparent conductive layer 16 and the second semiconductor material layer 14 of the semiconductor epitaxial stack unit 4, the transparent conductive layer 16 and the second semiconductor material layer 14 are schematically apart while in fact the transparent conductive layer 16 and the second semiconductor material layer 14 contact directly. The material of the transparent conductive layer 16 comprises indium tin oxide, cadmium tin oxide, zinc oxide, indium oxide, tin oxide, copper aluminum oxide, copper gallium oxide, strontium copper oxide, aluminum zinc oxide, zinc gallium oxide, and the arbitrary combination mentioned above. In order to increase the light emission efficiency or the absorption efficiency of the device, the preferred condition is that the transmittance of the transparent conductive layer 16 covered on the semiconductor epitaxial stack unit 4 should be larger than 90%.

As shown in FIG. 7A, in order to electrically connect the device and the outside, in the embodiment, the operating substrate 7 further comprises a first electrode 11 disposed on an area excluding the directly contacting part 18 and the directly contacting corresponding part 18' of the transparent conductive layer 16 to electrically connect to the semiconductor epitaxial stack unit 4 by the transparent conductive layer 16. Because the transparent materials are covered on top side of the semiconductor epitaxial stack unit 4, either the light emission efficiency or the absorption efficiency of the semiconductor optoelectronic device 20 increases largely. In order to improve the reliability and the efficiency of the device structure, part of the semiconductor epitaxial stack unit 4 surface is protected by an insulating layer 17 like silicon oxide or silicon nitride. In addition, an adhesive layer 10 is further optionally disposed between the semiconductor epitaxial stack unit 4 and the operating substrate 7 to achieve the effect of being adhered to each other in the structure as described above.

FIG. 8 illustrates the semiconductor optoelectronic device 30 according to one embodiment of the present application. Other than the structure similar to those in the above embodiments, the first electrode 11 of the semiconductor optoelectronic device 30 further comprises a plurality of metal wires 12 extending from the first electrode to the directly contacting corresponding part 18', which improves the electrical conductivity of the device by the low resistivity characteristics of metals. The top view of the semiconductor optoelectronic device 30 can refer to FIG. 6. The material of the first electrode 11 comprises titanium, aluminum, gold, chromium, nickel, germanium, and can be a single-layer or a multi-layer metal structure composed by the above-described alloy. The metal wire 12 preferably has a width smaller than 20 µm, and is optionally composed of material different from that of the first electrode 11.

In addition, in order to achieve the electrical conductivity purpose of the device, the structure further comprises a second electrode (not shown in the drawings) disposed between the semiconductor epitaxial stack unit 4 and the operating substrate 7, or on opposite side of the operating substrate 7 corresponding to the semiconductor epitaxial stack unit 4, namely, a bottom surface 71 of the operating substrate. In order to improve the light emission efficiency of the device or for other purposes, the surface of the operating substrate 7 also comprises a textured structure comprising at least one protrusion (not shown in the drawings) and/or at least one cavity (not shown in the drawings).

Figure 9A:
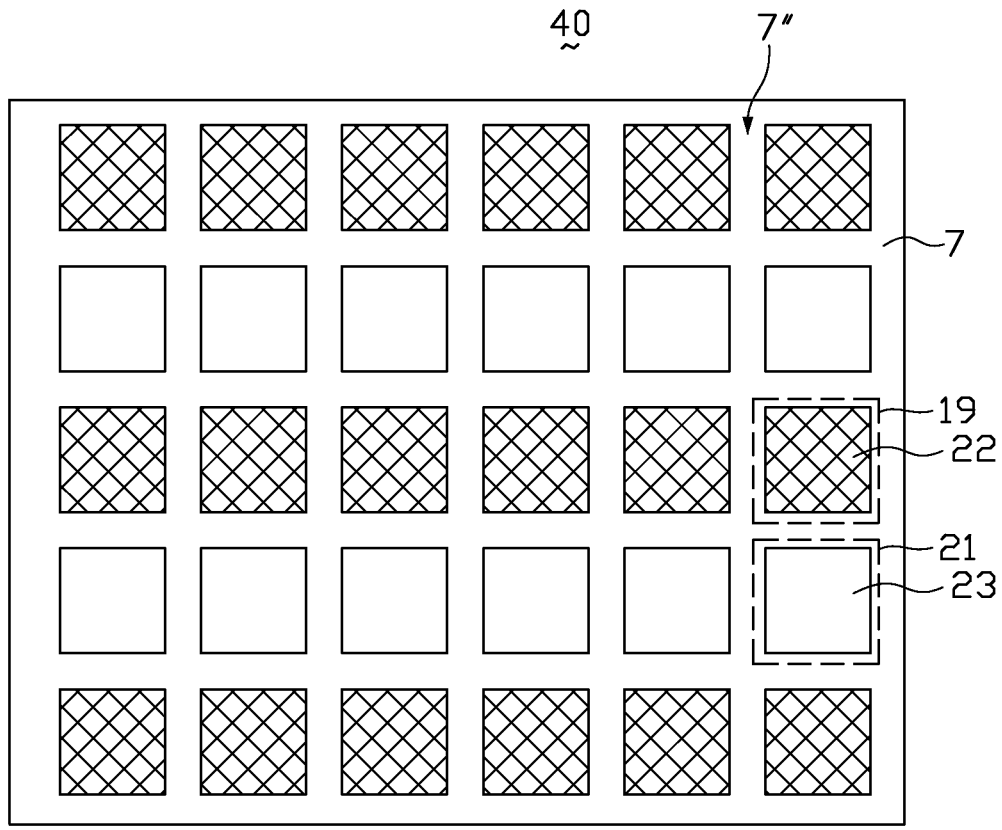
FIG. 9A illustrates a lateral view of a light-emitting diode device structure according to another embodiment of the present application.

FIG. 9A illustrates another light-emitting diode structure 40 according to one embodiment of the present application. The light-emitting diode structure 40 comprises an operating substrate 7 with an operating substrate surface 7". An operating substrate surface 7" comprises a plurality of first epitaxial areas 19 and a plurality of second epitaxial areas 21. Each of the epitaxial areas comprises one semiconductor optoelectronic device described above (here referring as the light-emitting diode device). That is, each of the epitaxial areas comprises one light-emitting diode epitaxial stack unit. The first epitaxial area 19 comprises a first light-emitting diode epitaxial stack unit 22 capable of emitting a first major emission wavelength. In the embodiment, the first major emission wavelength is the red light, and the wavelength is between 600 nm and 650 nm. Depending on the needs, the first major emission wavelength can be the green light between 510 nm and 550 nm, or be the blue light between 390 nm and 440 nm. The second epitaxial area 21 comprises a second light-emitting diode epitaxial stack unit 23 capable of emitting the second major emission wavelength. In the embodiment, the second major emission wavelength is the green light, and the wavelength is between 510 nm and 550 nm. As illustrated in the embodiment, the first major emission wavelength can be different from the second major emission wavelength.

With the method of the semiconductor optoelectronic device illustrated in the above-described embodiments, even the single operating substrate comprises two kinds (like structure 40) or more epitaxial stack units (here referring as the light-emitting diode epitaxial stack units capable of emitting different major emission wavelengths), the plurality of light-emitting diode epitaxial stack units disposed on the different positions of the single growth substrate and capable of emitting the same major emission wavelength is transferred from the growth substrate to the operating substrate easily. Taking the structure 40 of FIG. 9A as an example, only two transfer processes are needed. The preliminary structure of all of the epitaxial stack units disposed on the operating substrate is completed by the first transfer of the red light epitaxial stack unit from the growth substrate of the red light light-emitting diode device, and the second transfer of the green light epitaxial stack unit from the growth substrate of the green light light-emitting diode device. Without the one-by-one transferring by manual pick-up or mechanical pick-up, the process time is reduced.

Figure 9B:
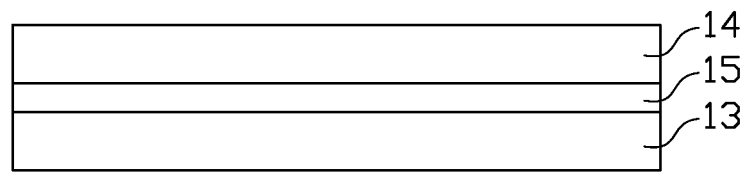
FIG. 9B illustrates a lateral view of the semiconductor epitaxial stack unit according to FIG. 9A.

As shown in FIG. 9B, in the light-emitting diode structure 40, each of the light-emitting diode epitaxial stack units 22 and 23 respectively comprises a first semiconductor material layer 13 having a first electrical conductivity such as the p-type semiconductor material layer, a second semiconductor material layer 14 having a second electrical conductivity disposed on the first semiconductor material layer 13 such as the n-type semiconductor material layer, and a light-emitting layer 15 disposed between the first semiconductor material layer 13 and the second semiconductor material layer 14.

In addition, as described in the above embodiment, in order to achieve the electrical conductivity purpose of the device, in the structure 40, each first light-emitting diode epitaxial stack unit 22 and/or each second light-emitting diode epitaxial stack unit 23 further comprises a first electrode (not shown in the drawings) disposed on opposite side of the semiconductor epitaxial stack unit corresponding to the operating substrate. In the embodiment, the first electrode is disposed on the semiconductor epitaxial stack unit, or between the semiconductor epitaxial stack unit and the surface 7" of the operating substrate 7, or on opposite side of the operating substrate 7 corresponding to the semiconductor epitaxial stack unit (namely, the bottom surface of the operating substrate). In order to increase the light emission efficiency of the device or for other purposes, the surface of the operating substrate 7 also comprises the textured structure comprising at least one protrusion (not shown in the drawings) and/or at least one cavity (not shown in the drawings).

Figure 10:
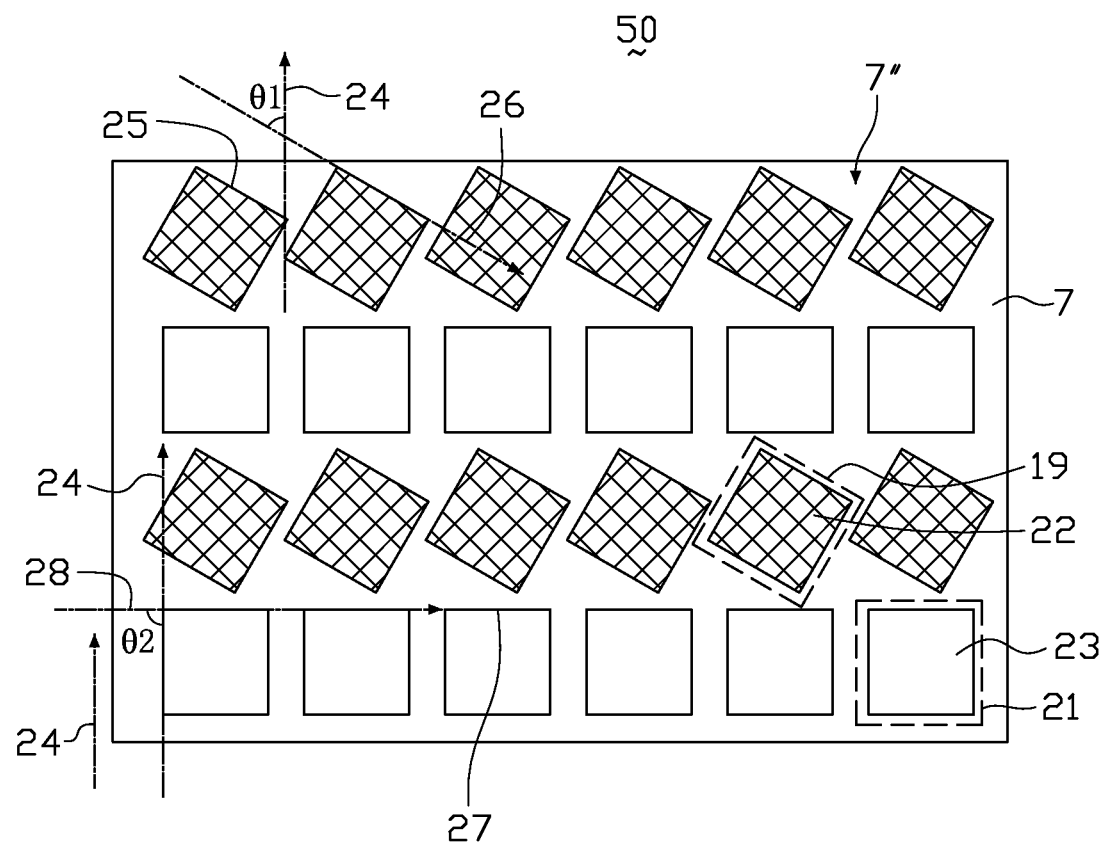
FIG. 10 illustrates a lateral view of a light-emitting diode device structure according to another embodiment of the present application.

During each time of the transfer processes, there is the possibility of miss-alignment between the operating substrate 7 and the transfer structure 6(6"). The light-emitting diode structure with the selective transfer process may incur the miss-alignment as shown in FIG. 10. Taking the light-emitting diode structure 50 as an example, a first direction 24 is defined to be vertical to the normal line of the surface 7" of the operating substrate 7 as shown in FIG. 10. Because all of the first light-emitting diode epitaxial stack units 22 capable of emitting the first major emission wavelength are transferred to the operating substrate 7 in the same time, the angle shift of the transfer structure indirectly affects all of the first light-emitting diode epitaxial stack units 22 attached to the transfer structure to have the same alignment angle shift. Similarly, the second light-emitting diode epitaxial stack units 23 capable of emitting the second major emission wavelength are transferred to the operating substrate 7 in the same time, so there is the same effect of alignment angle shift. Taking one of the first light-emitting diode epitaxial stack units 22 as an example which has a first side 25 parallel to the surface 7" of the operating substrate 7, extending the extension line along the first side 25 of every first light-emitting diode epitaxial stack unit 22, and all the extension lines having a first extension direction 26 that are substantially parallel. Similarly, taking one of the second light-emitting diode epitaxial stack units 23 as an example which has a first side 27 parallel to the surface 7" of the operating substrate 7 corresponding to the first light-emitting diode epitaxial stack unit 22 extending the extension line along the first side 27 of every second light-emitting diode epitaxial stack unit 23, and all the extension lines having a second extension direction 28 that are substantially parallel. The alignment angle shifts generated from the two transfer processes are not the same. Taking the first direction 24 as a basis, there is an angle $\theta_1$ disposed between the first extension direction 26 and the first direction 24, and an angle $\theta_2$ disposed between the second extension direction 28 and the first direction 24, wherein $\theta_1$ is not equal to $\theta_2$. In the embodiment, $\theta_1$ approximately equals to 70 degrees and $\theta_2$ approximately equals to 90 degrees.

The transfer method of the semiconductor optoelectronic device illustrated in the present application completely keeps the growth substrate of the semiconductor optoelectronic device for repeated use. The transfer method also transfers the multi semiconductor optoelectronic device units to the operating substrate in single transfer process by the selective method, thus the process is simplified. The method has the advantage of cost reduction and process time reduction for the manufacture of the multi-color light-emitting device or the multi-color display.

The principle and the efficiency of the present application illustrated by the embodiments above are not the limitation of the application. Any person having ordinary skill in the art can modify or change the aforementioned embodiments. Therefore, the protection range of the rights in the application will be listed as the following claims.

What is claimed is:

1. A light-emitting device, comprising:
   an operating substrate, wherein an entirety of the operating substrate is flat;
   a plurality of first light-emitting diode epitaxial stack units arranged in a form of multiple first rows parallel to each other and capable of emitting a first major emission wavelength; and
   a plurality of second light-emitting diode epitaxial stack units arranged in a form of multiple second rows parallel to each other and capable of emitting a second major emission wavelength different from the first major emission wavelength,
   wherein the multiple first rows and the multiple second rows are alternately disposed,
   wherein each of the plurality of first light-emitting diode epitaxial stack units has a first rectangular border from a top view, each of the plurality of second light-emitting diode epitaxial stack units has a second rectangular border from a top view, and one side of the first rectangular border is neither parallel nor perpendicular to one side of the second rectangular border, and
   wherein at least one of the first light-emitting diode epitaxial stack units is devoid of an original growth substrate on which the at least one of the first light-emitting diode epitaxial stack units is originally formed.

2. The light-emitting device as claimed in claim 1, wherein the range of the first major emission wavelength is between 600 nm and 650 nm, 510 nm and 550 nm, or 390 nm and 440 nm.

3. The light-emitting device as claimed in claim 1, wherein the first light-emitting diode epitaxial stack unit and the second light-emitting diode epitaxial stack unit each comprising:
   a semiconductor epitaxial stack disposed on the operating substrate, comprising:
   a first semiconductor material layer having a first electrical conductivity disposed on the operating substrate;
   a second semiconductor material layer having a second electrical conductivity disposed on the first semiconductor material layer; and
   a light-emitting layer disposed between the first semiconductor material layer and the second semiconductor material layer.

4. The light-emitting device as claimed in claim 3, wherein the first light-emitting diode epitaxial stack unit and/or the second light-emitting diode epitaxial stack unit each further comprise a first electrode disposed on a side of the semiconductor epitaxial stack opposite to the operating substrate, between the semiconductor epitaxial stack and the operating substrate, or on a side of the operating substrate opposite to the semiconductor epitaxial stack.

5. The light-emitting device as claimed in claim 1, wherein the operating substrate further comprises a rough surface comprising at least a protrusion and/or a cavity.

6. The light-emitting device as claimed in claim 1, further comprising an adhesive layer disposed between the operating substrate and the first light-emitting diode epitaxial stack unit and/or between the operating substrate and the second light-emitting diode epitaxial stack unit, wherein the material of the adhesive layer comprises organic polymer material, metal material, or metal alloy.

* * * * *